United States Patent
van Nguyen

(10) Patent No.: US 6,621,426 B1
(45) Date of Patent: Sep. 16, 2003

(54) METHOD AND APPARATUS FOR MODULATING A SIGNAL

(75) Inventor: Cap van Nguyen, Dallas, TX (US)

(73) Assignee: VDV Media Technologies, Inc., Dallas, TX (US)

( * ) Notice: Subject to any disclaimer, the term of this patent is extended or adjusted under 35 U.S.C. 154(b) by 0 days.

(21) Appl. No.: 10/267,069

(22) Filed: Oct. 7, 2002

Related U.S. Application Data

(63) Continuation of application No. 09/619,003, filed on Jul. 19, 2000, now Pat. No. 6,462,679.

(51) Int. Cl.⁷ ................................................ H03M 7/00
(52) U.S. Cl. ........................................ 341/50; 375/281
(58) Field of Search ............................. 341/50; 370/482, 370/487, 490; 725/136, 139; 348/731; 375/281, 303, 257

(56) References Cited

U.S. PATENT DOCUMENTS

| | | | |
|---|---|---|---|
| 3,573,621 A | 4/1971 | Ulstad et al. | 325/38 |
| 3,754,101 A | 8/1973 | Daspit et al. | 179/15 |
| 3,773,975 A | * 11/1973 | Koziol | 375/303 |
| 3,845,412 A | 10/1974 | Rearwin et al. | 332/9 |
| 3,849,595 A | 11/1974 | Ishiguro | 178/6 |
| 3,937,882 A | 2/1976 | Bingham | 178/69 |
| 4,085,449 A | 4/1978 | Walsh et al. | 364/900 |
| 4,263,670 A | 4/1981 | Sherman | 375/9 |
| 4,433,310 A | 2/1984 | Bic et al. | 332/9 |
| 4,584,541 A | 4/1986 | Nossen | 332/16 |
| 4,613,974 A | 9/1986 | Vokac et al. | 375/37 |
| 4,646,326 A | 2/1987 | Backof, Jr. et al. | 375/39 |
| 4,937,821 A | 6/1990 | Boulton | 370/482 |
| 5,020,104 A | 5/1991 | Ciulin | 380/6 |
| 5,128,964 A | 7/1992 | Mallory | 375/39 |
| 5,598,435 A | 1/1997 | Williams | 375/261 |
| 5,675,609 A | 10/1997 | Johnson | 375/237 |
| 5,978,419 A | * 11/1999 | Cassiday et al. | 375/257 |
| 5,991,278 A | 11/1999 | Betts | 370/276 |
| 6,028,891 A | 2/2000 | Ribner et al. | 375/222 |

\* cited by examiner

*Primary Examiner*—Jean Bruner Jeanglaude
(74) *Attorney, Agent, or Firm*—Nguyen, P.C.; Linh T. Nguyen

(57) ABSTRACT

A modulated signal (10) is sinusoidal wave signal wherein each half wave cycle carries a digital data value associated with an amount of its amplitude. A positive half wave cycle with an amplitude of M encodes a binary level zero digital data value while a positive half wave cycle with an amplitude of M+x encodes a binary level one digital data value. Similarly, a negative half wave cycle with an amplitude of −M encodes a binary level zero digital data value while a negative half wave cycle with an amplitude of −M−x encodes a binary level one digital data value. The positive and negative half wave cycles may transport dual portions of a channel at the same frequency as a modulated signal (20) for either a dual transmission capability or as a full duplex bidirectional transmit/receive channel. Each half wave cycle may also be modulated to carry a plurality of digital data values beyond binary level zero and one through selection of four or more amplitude levels to generate a modulated signal (30). A modulated signal (40) may also provide digital data value representations in each quarter wave of the sinusoidal wave signal to further increase bandwidth capability.

21 Claims, 4 Drawing Sheets

METHOD AND APPARATUS FOR MODULATING A SIGNAL

RELATED APPLICATIONS

The present application is a continuation application of U.S. application Ser. No. 09/619,003 filed Jul. 19, 2000 now U.S. Pat. No. 6,462,679.

TECHNICAL FIELD OF THE INVENTION

The present invention relates in general to signal transmission, reception, and processing and more particularly to a method and apparatus for modulating a signal.

BACKGROUND OF THE INVENTION

The challenges for any high speed communications, whether it be over wireless, copper wire, fiber optic, or other means, is to provide sufficient bandwidth to meet user demand. With the advent of Internet access and video on demand, the demand for higher bandwidth has exponentially increased. Users want bandwidth for Internet connections, video applications, simultaneous Internet and telephony capability, and enhanced telephony data processing quality and feature sets. However, service providers want to utilize the existing infrastructure as much as possible but avoid having heavy data users from congesting the telephony network.

In order to use the existing wired, wireless, or fiber optic infrastructure to deliver high bandwidth to subscribers, certain modulation techniques have been implemented in order to provide a transmission capability. These modulation techniques include Amplitude Shift Keying, Frequency Shift Keying, Phase Shift Keying, Quadrature Amplitude Modulation, Carrierless Amplitude Phase Modulation, Frequency/Time/Code Division Multiple Access Discrete Multi-Tone, and various combinations of each technique. These modulation techniques require the use of mixing the baseband digital signal with a carrier signal. This mixing process requires further filtering to select the desired signal.

Existing modulation techniques also suffer from an intersymbol interference phenomenon. With any practical channel, the inevitable filtering effect will cause a spreading or smearing of individual data symbols through the channel. For consecutive symbols, this spreading causes part of the symbol energy to overlap with neighboring, symbols, resulting in intersymbol interference. Moreover, filtering in a transmitter or receiver may also introduce intersymbol interference degradation. Intersymbol interference can significantly degrade the ability of a receiver to differentiate a current symbol from diffused energy of adjacent symbols.

As can be seen, conventional modulation techniques suffer from low symbol state representation capabilities that limit the bandwidth of a digital communication system. Therefore, it is desirable to modulate a signal for transmission that avoids the problems inherent in conventional modulation techniques.

SUMMARY OF THE INVENTION

From the foregoing, it may be appreciated by those skilled in the art that a need has arisen for an improved modulation technique that reduces noise in signal transmission and reception and increases bandwidth capability in a communication system. In accordance with the present invention, a method and apparatus for modulating a signal are provided that substantially eliminate or reduce disadvantages and problems associated with conventional modulation techniques.

According to an embodiment of the present invention, there is provided a method for modulating a signal that includes generating a sinusoidal wave signal and encoding each half wave cycle of the sinusoidal wave signal with digital data.

The present invention provides various technical advantages over conventional modulation techniques. For example, one technical advantage is to avoid using a mixing process to perform modulation and avoid Manchester encoding for return to zero coding that reduces the available bandwidth. Another technical advantage is to provide full duplex bidirectional communications on the same modulated sinusoidal wave signal. Yet another technical advantage is to use the modulated sinusoidal wave signal to carry the encoded digital data as well as to provide a reference oscillator clock for synchronization between communication nodes. Still another technical advantage is to provide multiple symbol states per half wave or quarter wave sinusoidal wave signal. Other technical advantages may be readily apparent to those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Basic Asymmetric Amplitude Direct Modulation

Figure 1:
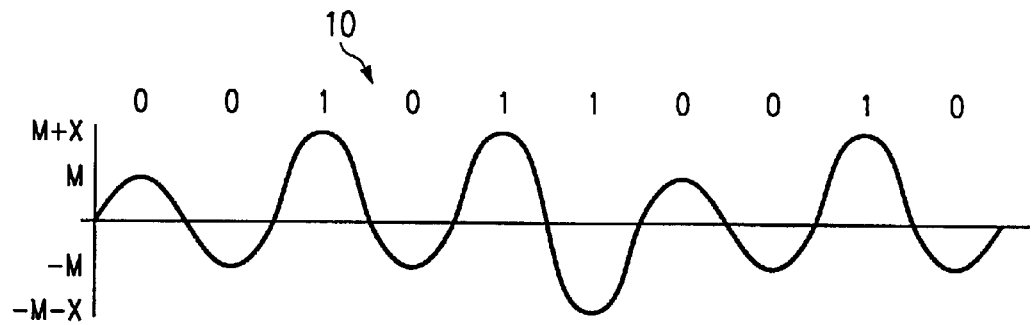
FIG. 1 illustrates an example of a modulated signal having asymmetric amplitude direct modulation according to the teachings of the present invention.

FIG. 1 shows an example of a modulated signal 10 modulated according to the teachings of the present invention. Modulated signal 10 is generated according to an Asymmetrical Amplitude Direct Modulation (AADM) technique. Modulated signal 10 is a sinusoidal wave signal wherein each half wave cycle is encoded with a digital data value. The digital data value is encoded into each half wave cycle of the sinusoidal wave signal by adjusting the amplitude of the half wave cycle according to the digital data value representation desired for transmission. For modulated signal 10, a positive half wave cycle representing a binary level zero state may have an amplitude of M. A positive half wave cycle representing a binary level one state may have an amplitude of M+x. Similarly, a negative half wave cycle representing a binary level zero state may have an amplitude of −M while a negative half wave signal representing a binary level one state may have an amplitude of −M−x. By adjusting an amplitude of each half wave cycle in modulated signal 10, a sinusoidal wave signal may be generated and transmitted with digitally encoded data embedded therein. Modulated signal 10 is shown with an exemplary digital encoding of 0010110010 and may be transmitted and received over a portion of a single transmissional reception link.

Figure 2:
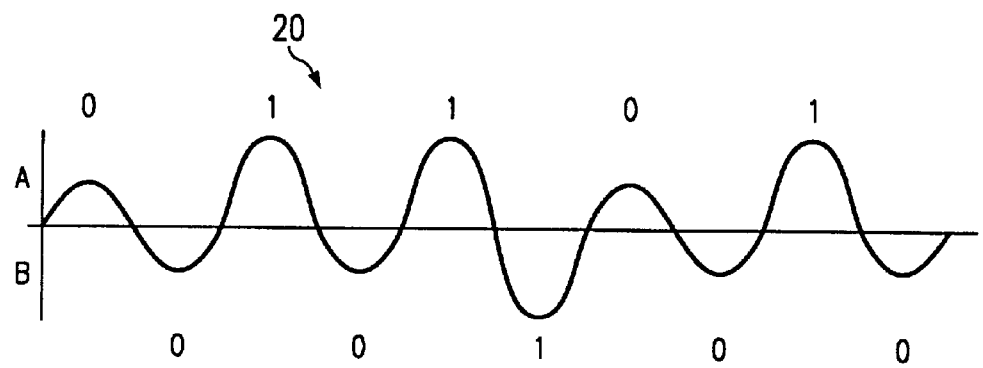
FIG. 2 illustrates an example of a modulated signal providing a bidirectional full duplex transmissional reception capability.

FIG. 2 shows another example of a modulated signal, in this case modulated signal 20. Modulated signal 20 is asymmetric over the x-axis so that each half, positive and negative, may carry a different set of digital data. Modulated signal 20 is encoded in a dual A and B portion of a channel configuration with one digital representation being carried in the positive half wave cycles and another digital representation being carried in the negative half wave cycles. This channel carries the A and B portions over a single frequency. In this configuration, modulated signal 20 has an exemplary digital encoding of 01101 in the positive half wave cycles for the portion of the channel A and 00100 in the negative half wave cycles for the B portion of the channel. Thus, modulated signal 20 can provide a dual portion channel transmission capability compared to the single portion channel transmission capability of modulated signal 10. Alternatively, the asymmetrical nature of modulated signal 20 allows for a bidirectional full duplex capability over a single transmission/reception link between two nodes in a signal transmission system. Portion A of the channel may provide a transmission capability from Node 1 to Node 2 while portion B of the channel may provide a transmission capability from Node 2 to Node 1. In this manner, a single transmission/reception link may be established between Node 1 and Node 2 that avoids having separate transmission and reception links between the two nodes.

Figure 3:
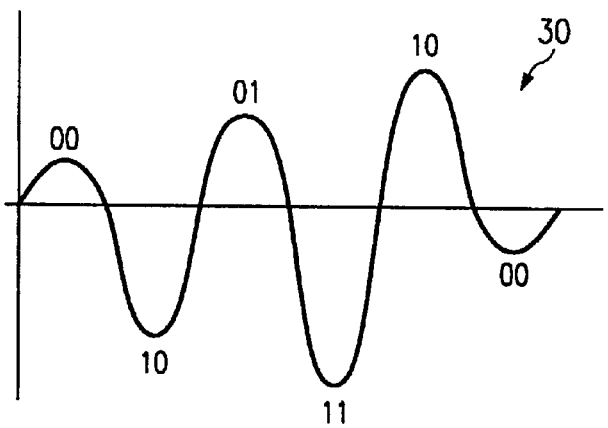
FIG. 3 illustrates yet another example of a modulated signal according to the teachings of the present invention.

FIG. 3 shows another example of a modulated signal, in this case modulated signal 30. Modulated signal 30 provides improved bandwidth over modulated signal 10 in that the number of states per symbol provided by each half wave cycle is increased. Instead of the binary implementation of modulated signal 10 wherein each half wave cycle represents either a binary level one or zero state, modulated signal 30 implements a multi-nary level technique wherein each half wave cycle may use a plurality of amplitude levels for digital data value encoding. Modulated signal 30 is shown with a four amplitude level capability where each half wave cycle may have an amplitude representing any of the digital data symbol set 00, 01, 10, and 11. Each symbol set may be encoded into a half wave cycle with a different amplitude corresponding to each two bit symbol. Though modulated signal 30 is shown using a four amplitude level capability, any number of amplitude levels may be implemented in order to provide a desired set of digital data value representations. Modulated signal 30 may also be transmitted/received pursuant to the capabilities discussed above with respect to modulated signals 10 and 20.

Figure 4:
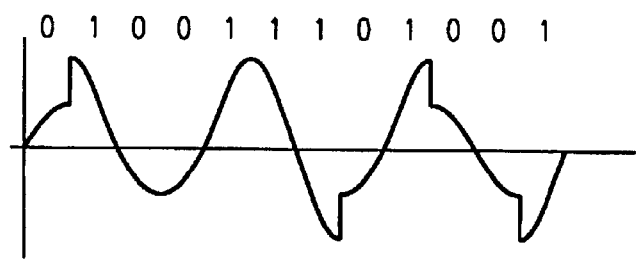
FIG. 4 illustrates another example of a modulated signal according to the teachings of the present invention.

FIG. 4 shows yet another example of a modulated signal, in this case modulated signal 40. For modulated signals 10, 20, and 30, each full wave cycle may also be partitioned into quarter wave sub-spaces. Each quarter wave sub-space may represent a separate signal symbol and include basic information such as amplitude, phase, frequency, and time. Each quarter wave sub-space may be used to modulate a symbol into each quarter of a full sinusoidal cycle of the modulated signal. Quarter wave sub-spacing can double the bandwidth capability as compared to the base half wave cycle amplitude encoding. Modulated signal 40 shows an exemplary digital data value representation where each bit is encoded into each quarter wave of the sinusoidal signal. Modulated signal 40 may also be transmitted/received according to the capabilities discussed above with respect to modulated signals 10, 20 and 30.

Modulated signals 10, 20, 30, and 40 are based on a simple sinusoidal wave signal. As a result, the zero voltage and current line will be crossed twice every cycle. Due to these zero crossings, a Return to Zero signal is generated instead of a Non-Return to Zero signal. A Non-Return to Zero signal requires Return to Zero processing to ensure that the symbol stream has very little if any energy at DC or near 0 Hz. Return to Zero processing included scrambling or encoding of the signal to prevent long strings of ones or zeros from being generated or transmitted. Scrambling of the signal encompasses reordering of the data symbols in the signal. However, scrambling introduces a processing overhead and latency into the system which may cause an unacceptable time delay in the signal transmission process. Data encoding schemes, such as through Manchester encoding, reduce the dc content of a signal but at the expense of bandwidth with a near doubling of the bandwidth needed to transmit the signal. The digital data encoding of each half wave cycle of the sinusoidal wave signal eliminates the need for Return to Zero processing. Therefore, there is no concern that the sinusoidal wave signal may carry long strings of ones or zeros that caused a corruption of data provided in signals modulated by conventional techniques.

Due to the zero crossings provided by modulated signals 10, 20, 30, and 40, transient noises accumulated during transmission are minimized when a sinusoidal waveform is used to directly carry the digital signal. Further, during an idle state with no digital data exchange, a constant amplitude sinusoidal waveform is transmitted by a master controller over a carrier signal. The sinusoidal waveform signal may serve as a reference oscillator clock to synchronize both the infrastructure and node equipment in a communications system.

The linear properties of the sinusoidal wave modulated signal provide distinct transmission and reception advantages. For example, the principle of superposition followed by a linear system allows for the transmission of multiple sinusoidal signals over the same transmission medium while retaining all information carried therein. By the frequency preservation property, the steady state response of a linear system to a sinusoidal input is a sinusoidal signal of the same frequency with possible variations in amplitude and phase. Since a narrow band of frequency is used, phase shift and amplitude change remain constant for easier signal decoding at the receiver end. Correction for any change in amplitude can be implemented through an amplifier with a gain having the same magnitude with the loss path in order to restore the originally transmitted signal. Intersymbol interference is thus avoided through the constant phase shift occurring during transmission. All symbols will shift the same amount so that no smearing occurs between consecutive symbols.

Analog Implementation

Figure 5A:
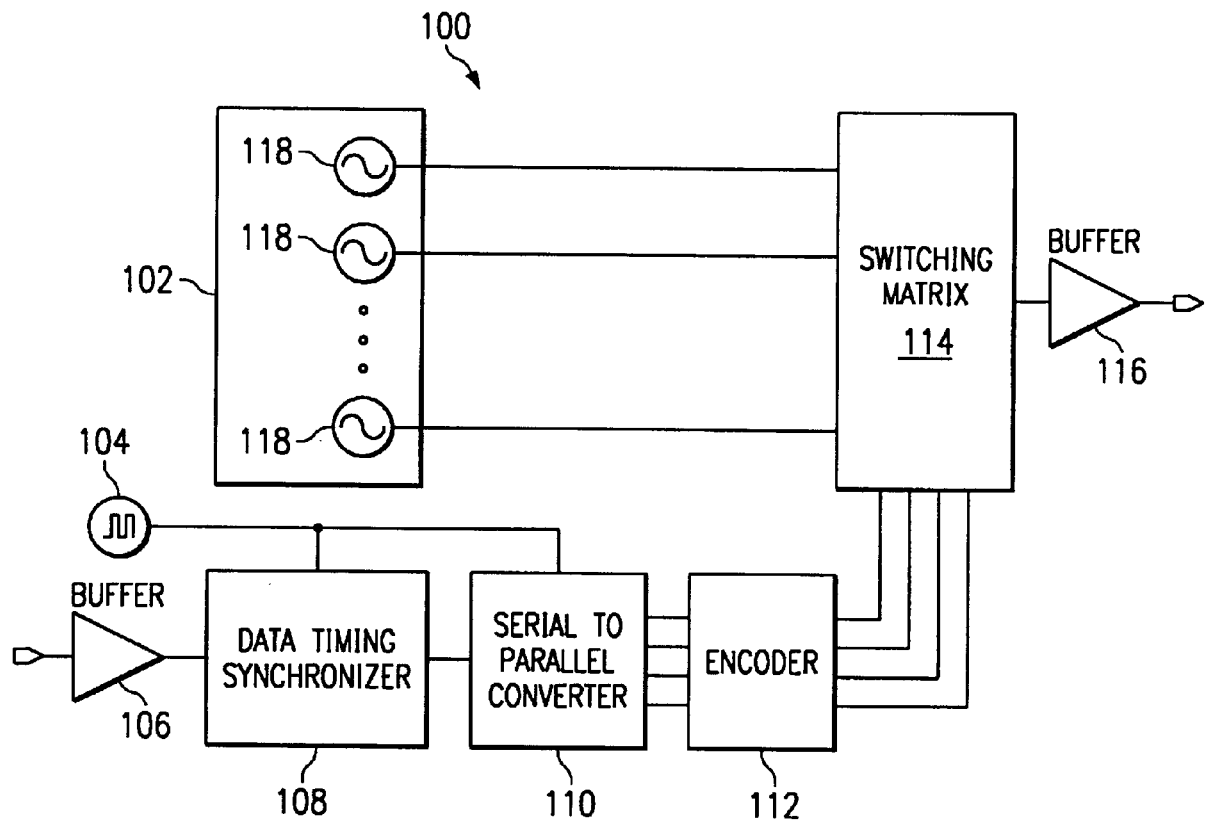
FIGS. 5A–B illustrate analog transmission and reception modules for modulating and demodulating the modulated signal.
Figure 5B:
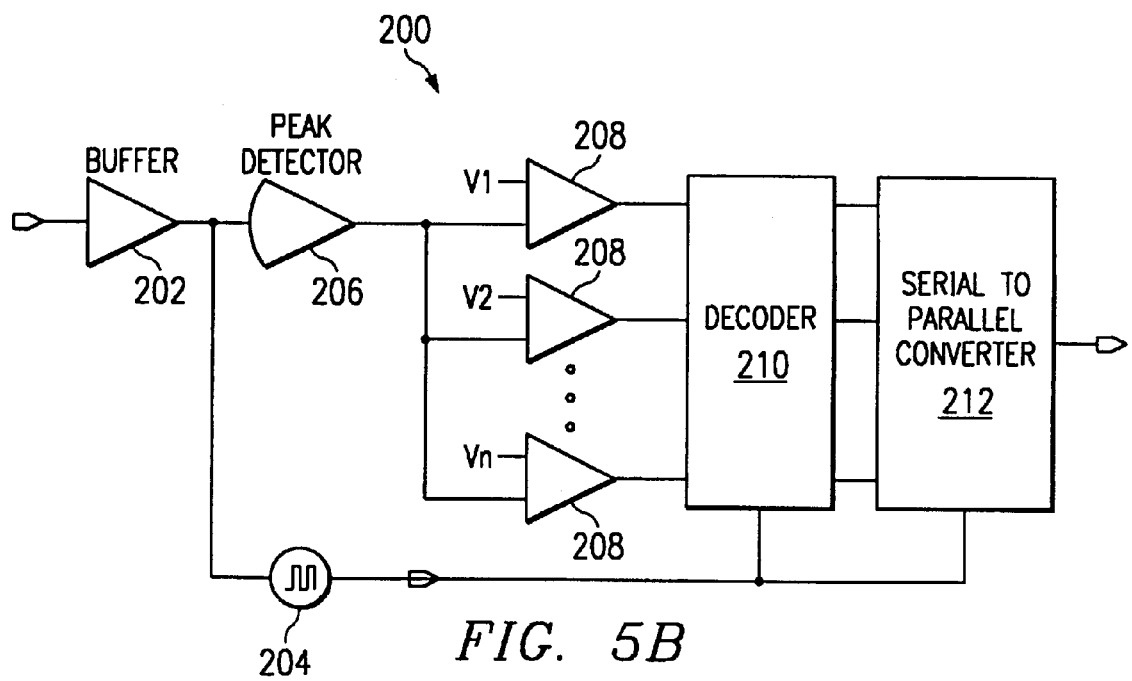

FIGS. 5A–B show an example analog implementation for performing asymmetrical amplitude direct modulation. FIG. 5A shows a transmission module 100 where a modulated signal output is generated. FIG. 5B shows a reception module 200 where the digital data is decoded from the modulated signal output.

In FIG. 5A, transmission module 100 includes a multiple sinusoidal wave generator 102, a synchronized square wave clock generator 104, an input buffer 106, a data timing synchronizer 108, a serial to parallel converter 110, an encoder 112, a switching matrix 114, and an output driver 116. Multiple sinusoidal wave generator 102 includes a plurality of sinusoidal wave generators 118 each generating a sinusoidal wave output signal at a different amplitude. The number of sinusoidal wave generators 118 is determined according to a number of amplitude levels desired for symbol state representation. For example, two sinusoidal wave generators 118 provide the minimum binary level one and zero state half wave cycle representations for encoding the modulated signal output. Four sinusoidal wave generators 118 allow for 00, 01, 10, and 11 digital encoding of the modulated output signal.

In operation, a serial stream of asynchronous digital data is received at input buffer 106. Input buffer 106 provides the digital data to data timing synchronizer 108 for synchronization with a square wave clock generated by synchronized square wave clock generator 104. The square wave clock is preferably in phase with sinusoidal wave output signals generated by sinusoidal wave generators 118. The synchronized digital data is provided to serial to parallel converter 110 in order to convert the serial digital data into a parallel format as synchronized by the square wave clock. In parallel form, the digital data represents a number of bits per data symbol to encode for a half wave cycle. The digital data in parallel format is provided to encoder 112. Encoder 112 generates encoding control signals in response to the parallel digital data to control the gating of switching matrix 114. Switching matrix 114 selectively places the sinusoidal wave outputs generated by sinusoidal wave generators 118 onto the modulated signal output according to the encoding control signals in order to generate one of modulated signals 10, 20, or 30. Output driver 116 then provides the generated modulated signal to the transmission medium.

In FIG. 5B, reception module 200 includes an input buffer 202, a clock recovery circuit 204, a peak detector 206, a plurality of peak comparators 208, a decoder 210, and a parallel to serial converter 212. Reception module 200 matches the line load of the reception medium and the signal level to the characteristics of reception module 200. Clock recovery circuit 204 uses the embedded sinusoidal signal received at input buffer 202 to generate a digital square wave in order to provide a reference clock for reception module 200 operation.

In operation, input buffer 202 receives a modulated signal through the reception medium. Input buffer 202 provides the modulated signal to peak detector 206 to capture an amplitude of the received modulated signal. The captured amplitude passes through the plurality of peak comparators 208 in order to determine the digital representation of the encoded symbol state. The digital representation is provided to decoder 210 to obtain the actual digital data that was encoded into the modulated signal. The actual digital data block, being in parallel form, is converted into a serial stream of digital data by parallel to serial converter 212 for output to other processing units. The number of peak comparators 208 corresponds to the number of amplitude levels that may be encoded into the modulated signal at transmission module 200. For example with a base binary level one and zero encoded modulated signal, reception module will only need to have peak comparator v1 and peak comparator v2. The reference input to peak comparator v1 will have a value sufficient enough to identify a binary level one or zero amplitude level. The reference input to peak detector v2 will have a value sufficient enough to identify only a binary level one amplitude level. In this manner, the outputs from peak comparators v1 and v2 can be decoded to extract the proper digital data from the modulated signal.

Digital Implementation

Figure 6:
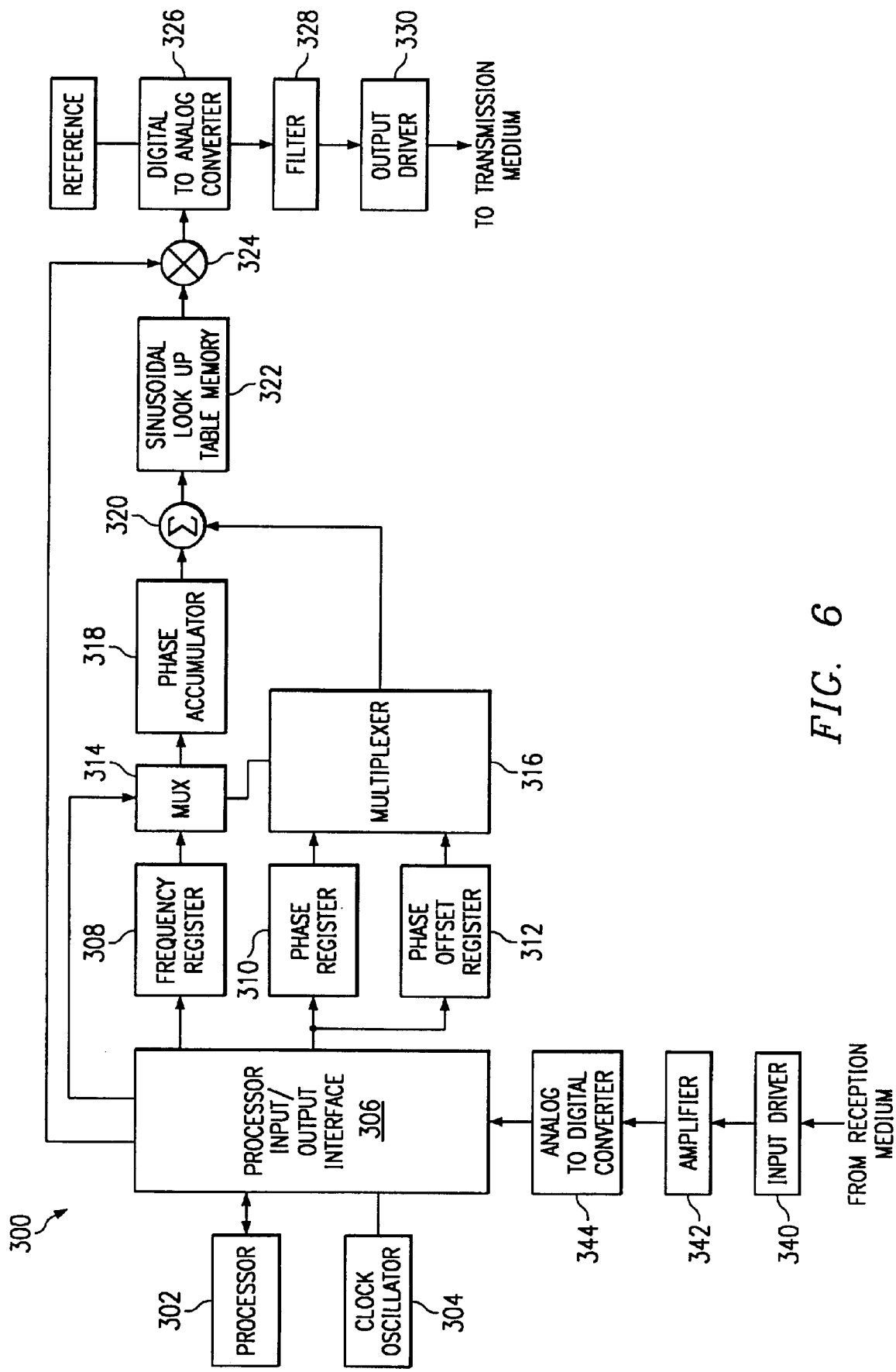
FIG. 6 illustrates a digital transmit/receive module for modulating and demodulating the modulated signal.

FIG. 6 shows an example digital implementation for performing asymmetrical amplitude direct modulation. FIG. 6 shows a transmit/receive module 300 for encoding and decoding a modulated signal. On the transmission side, transmit/receive module 300 includes a processor 302, a reference oscillator 304, a processor input/output interface 306, a frequency register 308, a phase register 310, a phase offset register 312, a first multiplexer 314, a second multiplexer 316, a phase accumulator 318, a summer 320, a sinusoidal look up table memory 322, a multiplier 324, a digital to analog converter 326, a filter 328, and an output driver 330. On the reception side, transmit/receive module 300 includes an input driver 340, an amplifier 342, and an analog to digital converter 344. Though shown as a hardware implementation, the functions provided by transmit/receive module 300 may be implemented in software through a digital signal processor or application specific integrated circuit implementations.

For transmission operation, processor 302 controls and performs the asymmetric amplitude direct modulation function. Digital data is encoded into a sinusoidal wave signal for transmission. The sinusoidal wave signal has amplitude, phase, frequency, and time components. The amplitude of a sinusoidal wave signal is non-linear and thus not easy to generate without piece wise reconstruction. The phase component of the sinusoidal wave signal is linear as it rotates through a fixed angle for each cycle. A continuous sinusoidal wave signal cycle has a phase range from zero to 2 pi that is repeated for each subsequent cycle. By knowing the linearity of the phase and the clock interval, the amplitude of the sinusoidal wave signal can be calculated. The main component of the signal generation is phase accumulator 318 that assembles the phase component for the modulated signal. Phase accumulator 318 is updated once each clock cycle. Each time phase accumulator 318 is updated, the number stored in phase offset register 312 is added to the content of phase accumulator 318. The output of phase accumulator 318 serves as an address for sinusoidal look up table memory 322. Each address corresponds to a phase point on the sinusoidal wave signal from zero to 2 pi. Sinusoidal look up table memory 322 contains the amplitude information for a complete cycle of a sinusoidal wave signal. Sinusoidal look up table 322 maps phase information from phase accumulator 318 into digital amplitude used to drive digital to analog converter 326 in generating an actual sinusoidal wave signal.

Amplitude modulation for each half wave cycle may be accomplished by combining the output of sinusoidal look up table 322 with digital data from processor 302 at multiplier 324. Another technique to provide the appropriate amplitude modulation to each half wave cycle is to vary a reference voltage to digital to analog converter 326. Phase accumulator 318 may be loaded from frequency register 308 through first multiplexer 314. The desired frequency for modulation may be selected by updating the contents of frequency register 308. Phase modulation may be performed using phase register 310 and phase offset register 312. The modulated sinusoidal wave signal output from digital to analog converter 326 passes through filter 328 to remove spurious and undesirable frequency components. The filtered sinusoidal wave signal is provided to output driver 330 so that the load and characteristics of the transmission medium may be matched.

For reception operation, input buffer 340 receives the modulated sinusoidal wave signal and passes it to amplifier 342. Amplifier 342 matches the modulated sinusoidal wave signal to analog to digital converter 344. Analog to digital converter 344 converts the modulated sinusoidal wave signal into digital form for processing by processor 302. The reception portion of transmit/receive module 300 uses analog to digital converter 344 early in the reception process in order to digitize the modulated sinusoidal wave signal so that all signal processing is performed in the digital domain. Processor 302 performs the peak amplitude detection and mapping into an actual digital data representation through reference value comparisons.

A critical considerations of asymmetric amplitude direct modulation is the ability to decode the received modulated sinusoidal wave signal accurately at very high speeds. Current technology for very high speed and high resolution analog to digital converters is either very costly or not available beyond 50 MHz. A goal in waveform sampling is to digitize only the minimum number of samples necessary to represent the waveform accurately and still allow accurate reconstruction on reception. The minimum rate at which an arbitrary waveform can be sampled without loss of information in theory is about twice the bandwidth of the waveform, otherwise known as the Nyquist sampling criterion. In practice, the sampling rate needs to be six or more times the bandwidth of the input waveform. Even at this desired sampling rate, zero crossing points and amplitude peaks are missed. A sub-sampling resolution accuracy algorithm is employed to improve the accuracy of detecting amplitude peaks using a lower sampling rate analog to digital converter. The algorithm uses a geometric calculus property of the first differential of a polynomial function technique in order to detect the amplitude peaks.

Figure 7:
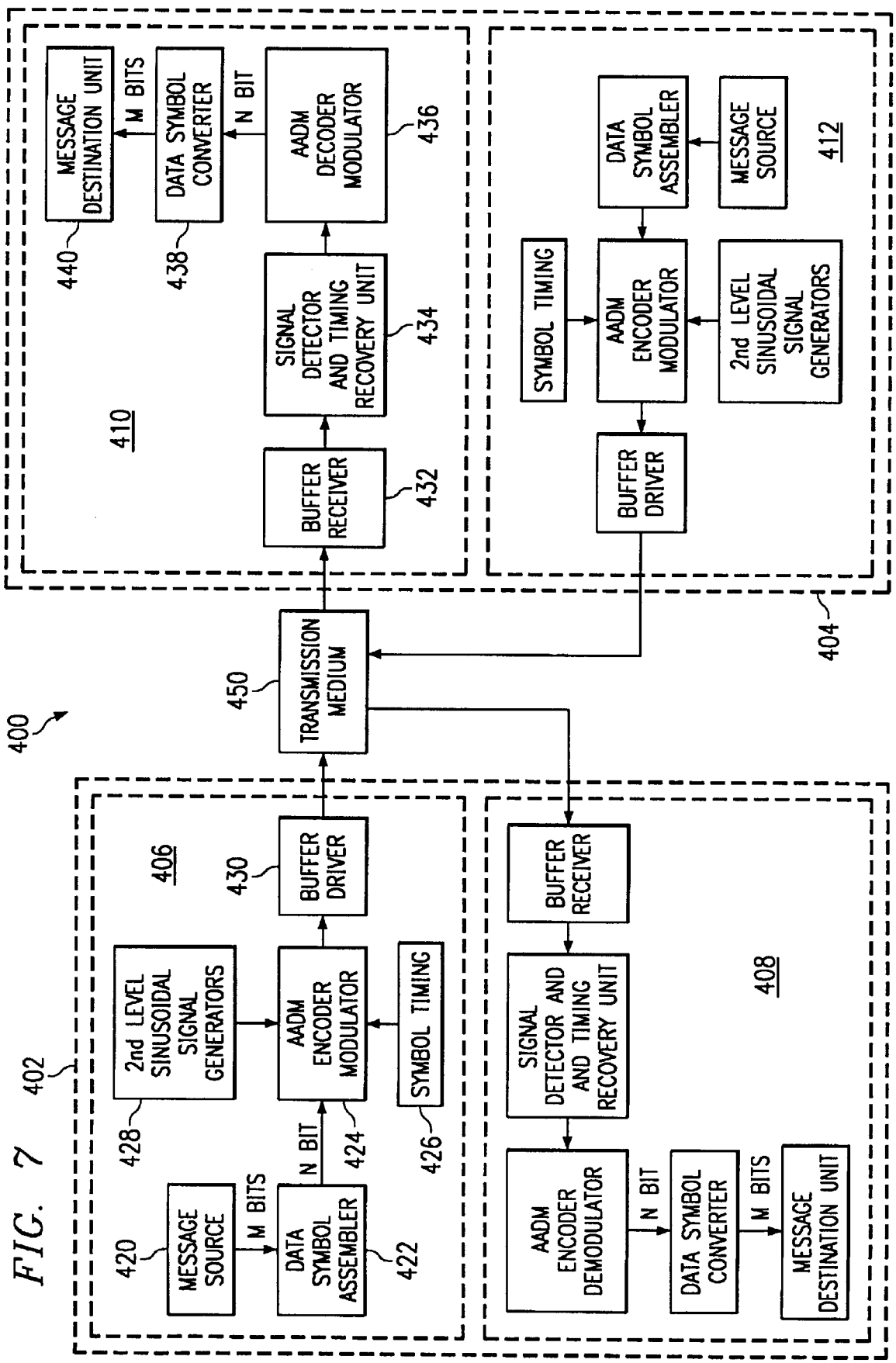
FIG. 7 illustrates a system incorporating the asymmetric amplitude direct modulation technique.

FIG. 7 is a block diagram of a system 400 incorporating the asymmetric amplitude direct modulation technique. System 400 includes a first node 402 and a second node 404. First node 402 includes a transmitter 406 and a receiver 408. Likewise, second node 404 includes a receiver 410 and a transmitter 412. Transmitter 406 of first node 402 includes a message source 420, a data symbol assembler 422, an AADM encoder/modulator 424, a symbol timing source 426, sinusoidal signal generators 428, and a buffer driver 430. Transmitter 412 of second node 404 may have similar components. Receiver 410 of second node 404 includes a buffer receiver 432, a signal detector and timing recovery unit 434, an AADM decoder/demodulator 436, a data symbol converter 438, and a message destination unit 440. Receiver 408 of first node 402 may have similar components.

For communicating information from first node 402 to second node 404, first node 402 provides an encoded signal using the AADM technique to second node 404 over a transmission medium 450. Transmission medium 450 may use any conventional technique for transmitting a signal, including wireless transmission, fiber optic transmission, wired transmission, any combination thereof, as well as any other signal transmission technique. To prepare for transmission, message source 420 sends an M bit stream of digital data to data symbol assembler 422. Data symbol assembler 422 assembles the M bit stream of digital data into an N bit data symbol. AADM encoder/modulator 424 converts the N bit data symbol into a $2^N$ levels continuous analog sinusoidal signal using symbol timing source 426 and sinusoidal signal generators 428. The AADM encoded signal is fed to buffer driver 430 to match the AADM encoded signal to transmission medium 450 for transmission.

Transmission medium 450 provides the AADM encoded signal to, for example, receiver 410 of second node 404. Buffer receiver 432 of receiver 410 reconditions the received AADM encoded signal through filtering and amplification to improve the signal quality of the AADM encoded signal for signal detection. Signal detector and timing recovery unit 434 detects and translates the AADM encoded signal into a symbol vector. AADM decoder/demodulator 436 converts the symbol vector into an N bit data symbol. Data symbol converter 438 converts the N bit data symbol into an M bit stream of digital data for processing by message destination unit 440. Bidirectional transmission as discussed above maybe accomplished using transmitter 412 of second node 404 and receiver 408 of first node 402 in the opposite direction using transmission medium 450 over the same channel and the same frequency.

Thus, it is apparent that there has been provided, in accordance with the present invention, a method and apparatus for modulating a signal that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. An apparatus for modulating a signal, comprising:
a plurality of sinusoidal wave generators, each sinusoidal wave generator operable to generate a sinusoidal wave signal with a different amplitude;
a switching matrix operable to generate a modulated sinusoidal wave signal in response to the plurality of sinusoidal wave generators, the modulated sinusoidal wave signal having unique amplitudes representing digital data encoded in the modulated sinusoidal wave signal.

2. The apparatus of claim 1, wherein the switching matrix selects one of the plurality of sinusoidal wave generators for each value of the digital data.

3. The apparatus of claim 2, wherein the switching matrix selects one of the plurality of sinusoidal wave generators for each half cycle of the modulated sinusoidal wave signal.

4. The apparatus of claim 2, wherein the switching matrix selects one of the plurality of sinusoidal wave generators for each quarter cycle of the modulated sinusoidal wave generator.

5. The apparatus of claim 1, further comprising:
an input buffer operable to receive the digital data.

6. The apparatus of claim 5, further comprising:
a data timing synchronizer operable to synchronize the digital data received at the input buffer to the plurality of sinusoidal wave generators.

7. The apparatus of claim 6, further comprising:
a square wave generator operable to provide a reference timing signal to the data timing synchronizer.

8. The apparatus of claim 5, further comprising:
an encoder operable to provide control signals to the switching matrix in response to the digital data received at the input buffer, the switching matrix operable to select among the plurality of sinusoidal wave generators in response to the control signals.

9. The apparatus of claim 1, wherein the plurality of sinusoidal wave generators provide a binary encoding capability to the modulated sinusoidal wave signal.

10. The apparatus of claim 1, wherein the plurality of sinusoidal wave generators provide a multi-nary encoding capability to the modulated sinusoidal wave signal.

11. An apparatus for modulating a signal, comprising:
a plurality of sinusoidal wave generators, each sinusoidal wave generator operable to generate a sinusoidal wave signal having an amplitude different than any other sinusoidal wave signal;
a switching matrix operable to generate a modulated sinusoidal wave signal in response to each sinusoidal wave signal received from the plurality of sinusoidal wave generators;
an input buffer operable to receive digital data, the switching matrix operable to select among the plurality of sinusoidal wave generators in response to the digital data;
a synchronizer operable to synchronize the digital data received at the input buffer to the plurality of sinusoidal wave generators;
an encoder operable to generate control signals in response to the digital data, the switching matrix operable to generate the modulated sinusoidal wave signal according to the control signals.

12. The apparatus of claim 11, further comprising:
an output buffer operable to provide the modulated sinusoidal wave signal to a transmission medium, the modulated sinusoidal wave signal being generated independent of the transmission medium.

13. The apparatus of claim 11, wherein the switching matrix selects among the plurality of sinusoidal wave generators in order to encode digital data into each half wave cycle of the modulated sinusoidal wave signal.

14. The apparatus of claim 11, wherein the switching matrix selects among the plurality of, sinusoidal wave generators in order to encode digital data into each quarter wave cycle of the modulated sinusoidal wave signal.

15. The apparatus of claim 11, wherein the plurality of sinusoidal wave generators provide binary and multi-nary encoding in the modulated sinusoidal wave signal.

16. A method of modulating a signal, comprising:
generating a plurality of sinusoidal wave signals, each sinusoidal wave signal having a different amplitude;
receiving a stream of digital data;
selecting one of the plurality of sinusoidal wave signals in response to each digital data representation in the stream of digital data;
generating a modulated sinusoidal wave signal in response to selection among the plurality of sinusoidal wave signals.

17. The method of claim 16, further comprising:
synchronizing the stream of digital data with the plurality of sinusoidal wave signals.

18. The method of claim 16, wherein the modulated sinusoidal wave signal has each digital data representation encoded into each of its half wave cycles.

19. The method of claim 16, wherein the modulated sinusoidal wave signal has each digital data representation encoded into each of its quarter wave cycles.

20. The method of claim 16, further comprising:
converting the stream of digital data into control signals for each digital data representation;
selecting among the plurality of sinusoidal wave signals in response to the control signals.

21. The method of claim 16, further comprising:
transmitting the modulated sinusoidal wave signal over a transmission medium, the modulated sinusoidal wave signal being generated independent from the transmission medium.

* * * * *